(12) United States Patent
Pillarisetty et al.

(10) Patent No.: US 10,497,871 B2
(45) Date of Patent: Dec. 3, 2019

(54) HIGH RETENTION RESISTIVE RANDOM ACCESS MEMORY

(71) Applicant: Intel Corporation, Santa Clara, CA (US)

(72) Inventors: Ravi Pillarisetty, Portland, OR (US); Prashant Majhi, San Jose, CA (US); Uday Shah, Portland, OR (US); Niloy Mukherjee, Portland, OR (US); Elijah V. Karpov, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,845

(22) PCT Filed: Dec. 26, 2015

(86) PCT No.: PCT/US2015/000369
§ 371 (c)(1),
(2) Date: May 17, 2018

(87) PCT Pub. No.: WO2017/111813
PCT Pub. Date: Jun. 29, 2017

(65) Prior Publication Data
US 2018/0331288 A1 Nov. 15, 2018

(51) Int. Cl.
*H01L 45/00* (2006.01)

(52) U.S. Cl.
CPC .......... *H01L 45/1675* (2013.01); *H01L 45/08* (2013.01); *H01L 45/12* (2013.01);
(Continued)

(58) Field of Classification Search
CPC . H01L 45/08; H01L 45/1233; H01L 45/1253; H01L 45/146; H01L 45/1675
See application file for complete search history.

(56) References Cited

U.S. PATENT DOCUMENTS 8,343,813 B2 * 1/2013 Kuse ..................... H01L 45/146
257/2
8,373,149 B2 * 2/2013 Takahashi ........... H01L 27/2436
257/2

(Continued)

FOREIGN PATENT DOCUMENTS

KR 20150011925 A 2/2015

OTHER PUBLICATIONS

The International Searching Authority, Written Opinion of the International Searching Authority and the International Search Report dated Sep. 26, 2016 in International Application No. PCT/US2015/000369.

(Continued)

Primary Examiner — Allison Bernstein
(74) Attorney, Agent, or Firm — Trop, Pruner & Hu, P.C.

(57) ABSTRACT

An embodiment includes a resistive random access memory (RRAM) comprising: top and bottom electrodes; first and second oxygen exchange layers (OELs) between the top and bottom electrodes; an oxide layer between the first and second OELs; wherein (a) first oxygen vacancies are within an upper third of the oxide layer at a first concentration, (b) second oxygen vacancies are within a lower third of the oxide layer at a second concentration, and (c) third oxygen vacancies are within a middle third of the oxide layer at a third concentration that is less than either of the first and second concentrations. Other embodiments are described herein.

25 Claims, 4 Drawing Sheets

(52) U.S. Cl.
CPC ...... *H01L 45/1233* (2013.01); *H01L 45/1253* (2013.01); *H01L 45/146* (2013.01)

(56) References Cited

U.S. PATENT DOCUMENTS

| | | | |
|---|---|---|---|
| 8,664,632 B2* | 3/2014 | Matsushita | H01L 45/085 |
| | | | 257/4 |
| 8,896,059 B1 | 11/2014 | Kim | |
| 8,913,418 B2* | 12/2014 | Wang | G11C 13/0002 |
| | | | 257/4 |
| 9,153,624 B2* | 10/2015 | Jo | H01L 45/08 |
| 9,246,085 B1* | 1/2016 | Wang | H01L 45/08 |
| 2008/0135834 A1 | 6/2008 | Kaza et al. | |
| 2010/0002491 A1 | 1/2010 | Hwang et al. | |
| 2012/0032132 A1* | 2/2012 | Lee | H01L 27/2409 |
| | | | 257/4 |
| 2012/0313069 A1 | 12/2012 | Wang et al. | |
| 2013/0344649 A1 | 12/2013 | Gallo | |
| 2014/0017403 A1 | 1/2014 | Chu et al. | |
| 2014/0145135 A1 | 5/2014 | Gee et al. | |
| 2014/0185358 A1 | 7/2014 | Jo et al. | |
| 2015/0102279 A1 | 4/2015 | Fujii et al. | |
| 2015/0155486 A1 | 6/2015 | Kuse et al. | |
| 2015/0279479 A1* | 10/2015 | Li | G11C 17/18 |
| | | | 365/96 |
| 2016/0163979 A1* | 6/2016 | Lee | H01L 45/145 |
| | | | 257/4 |
| 2018/0309054 A1* | 10/2018 | Majhi | H01L 45/08 |

OTHER PUBLICATIONS

U.S. Appl. No. 15/755,571, filed Feb. 27, 2018 and titled "High Retention Resistive Random Access Memory," by Prashant Majhi et al.

* cited by examiner and oxide layer 221. A first plurality of oxygen vacancies
HIGH RETENTION RESISTIVE RANDOM ACCESS MEMORY

TECHNICAL FIELD

Embodiments of the invention are in the field of semiconductor devices and, in particular, non-volatile memory.

BACKGROUND

Resistive random access memory (RRAM or ReRAM) relies on a class of materials that switch in a one-time event from a virgin insulating state to a low resistive state by way of a "forming" event. In the forming event, the device goes through "soft breakdown" in which a localized filament forms in a dielectric layer located between two electrodes. This filament shunts current through the filament to form a low resistance state. The RRAM switches from a low to a high resistive state (by disbanding the filament) and from a high to a low resistive state (by reforming the filament) by applying voltages of different polarities to the electrodes to switch the state. Thus, conventional RRAM can serve as a memory.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figures 1, 2:
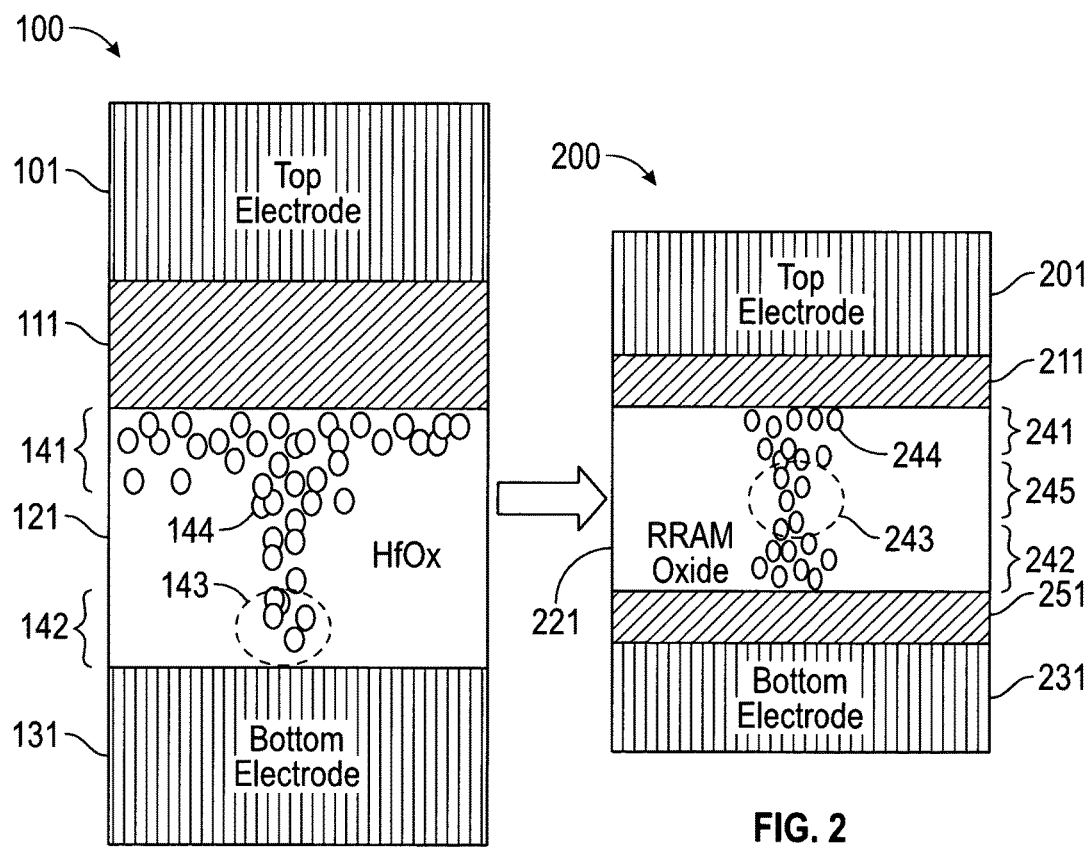
FIG. 1 includes a conventional RRAM stack.
FIG. 2 includes a RRAM stack in an embodiment of the invention.

FIG. 1 includes a conventional RRAM stack 100 including top electrode 101, oxygen exchange layer (OEL) 111 (e.g., Hf, Ti, and the like), oxide 121 (e.g., HfOx), and bottom electrode 131. Oxygen vacancies 144 have a higher concentration in region 141 and a relatively lower concentration in region 142. The vacancies collectively form a filament that serves as a memory. As addressed above, a "soft breakdown" occurs whereby, for example, an anneal takes place such that oxygen is scavenged by OEL 111 thereby producing vacancies 144. The vacancies cluster near the OLU/oxide interface (interface between layers 111 and 121) because that is where the scavenging takes place. Biasing electrodes 101, 131 with one polarity may purposely remove vacancies in area 143 to disband or disrupt the filament and create a high resistance state (a "0" memory state). Reversing the bias to electrodes 101, 131 with an opposite polarity may reform vacancies in area 143 to reform the filament and create a low resistance state (a "1" memory state).

Applicant determined the "1" state is at times not "retained" as the vacancies disband over time once bias is removed from electrodes 101, 131. As such, any memory based on stack 100 is unstable—a quality undesirable for non-volatile memories.

However, Applicant has addressed the retention issue. FIG. 2 includes an embodiment of an RRAM memory thin film stack with improved reliability and switching properties. In particular, the embodiment uses a Dual OEL RRAM stack having two OELs. In a conductive state the conductive filament has an "hourglass" filament shape (although such a shape is not necessarily present in all embodiments). The invention allows the RRAM switching to occur in the bulk of the RRAM film (e.g., middle third of the oxide layer) away from any interfaces with any OEL. This can provide improved retention/endurance considering interfaces between layers, such as the interface between layers 131 and 121, can be subject to uneven surfaces, fractures, and general imperfections that can lead to inconsistencies in holding a memory state. Thus, the embodiment of FIG. 2 provides for high retention (of the filament oxygen vacancies) properties. Such an embodiment improves the reliability of filamentary based RRAM memory and makes the memory more suitable for, as an example, embedded non-volatile memory.

FIG. 2 includes RRAM memory stack 200 comprising top electrode 201, bottom electrode 231, OEL 211, OEL 251, and oxide layer 221. A first plurality of oxygen vacancies 241 are adjacent OEL 211 at a first concentration, a second plurality of oxygen vacancies 242 are adjacent OEL 251 at a second concentration, and a third plurality of oxygen vacancies 245 are between pluralities 241, 242 and at a third concentration that is less than the first and second concentrations. "Adjacent" or "immediately adjacent", as used herein, are relative terms. Thus, vacancies 242 are adjacent layer 251 but not layer 211 and vacancies 241 are adjacent layer 211 but not layer 251.

In an embodiment OEL 211 and OEL 251 each include a metal such as one or more of the following: Copper (Cu), Hafnium (Hf), Titanium (Ti), Ruthenium (Ru), Aluminum (Al), and Silver (Ag).

In an embodiment the oxide layer 221 includes at least one of $HfO_2$, $SiO_2$, $Al_2O_3$, $TiO_2$, $SrTiO_3$, $Cr$—$SrTiO_3$, $NiO$, CuOx, $ZrO_2$, $Nb_2O_5$, MgO, $Fe_2O_3$, $Ta_2O_5$, ZnO, CoO, CuMnOx, CuMoOx, InZnO, Cr—$SrZrO_3$, $PrCaMnO_3$, $SrLaTiO_3$, $LaSrFeO_3$, $(Pr,Ca)MnO_3$, Nb—$SrTiO_3$, and $LaSrCoO_3$. In an embodiment top electrode 201 includes at least one of Hf, Ti, Ta, Pd, W, Mo, and Pt (e.g., TiN) and the bottom electrode 231 includes at least one of Hf, Ti, Ta, Pd, W, Mo, and Pt (e.g., TiN). Additionally, electrodes 201, 231 may include multiple layers of materials with differing properties.

In an embodiment the oxide layer 221 directly contacts OELs 211, 251 to allow for scavenging of oxygen from oxide layer 221 and the resultant creation of vacancies 244.

RRAM stack 200 is a functioning nonvolatile memory in that in a first state (when energy is applied to the top electrode at a first polarity) the first, second, and third pluralities of oxygen vacancies form a first filament having a first electrical resistance; and in a second state (when energy is applied to the top electrode at a second polarity, which is opposite the first polarity) the first, second, and third pluralities of oxygen vacancies form a different filament configuration or discontinuity thereby causing the higher resistivity.

In the second state the third plurality of oxygen vacancies 245 is at a low concentration (third concentration) and in the first state the third plurality of oxygen vacancies 245 is at a concentration that is greater than the third concentration.

Figures 3A, 3B, 3C, 3D, 3E:
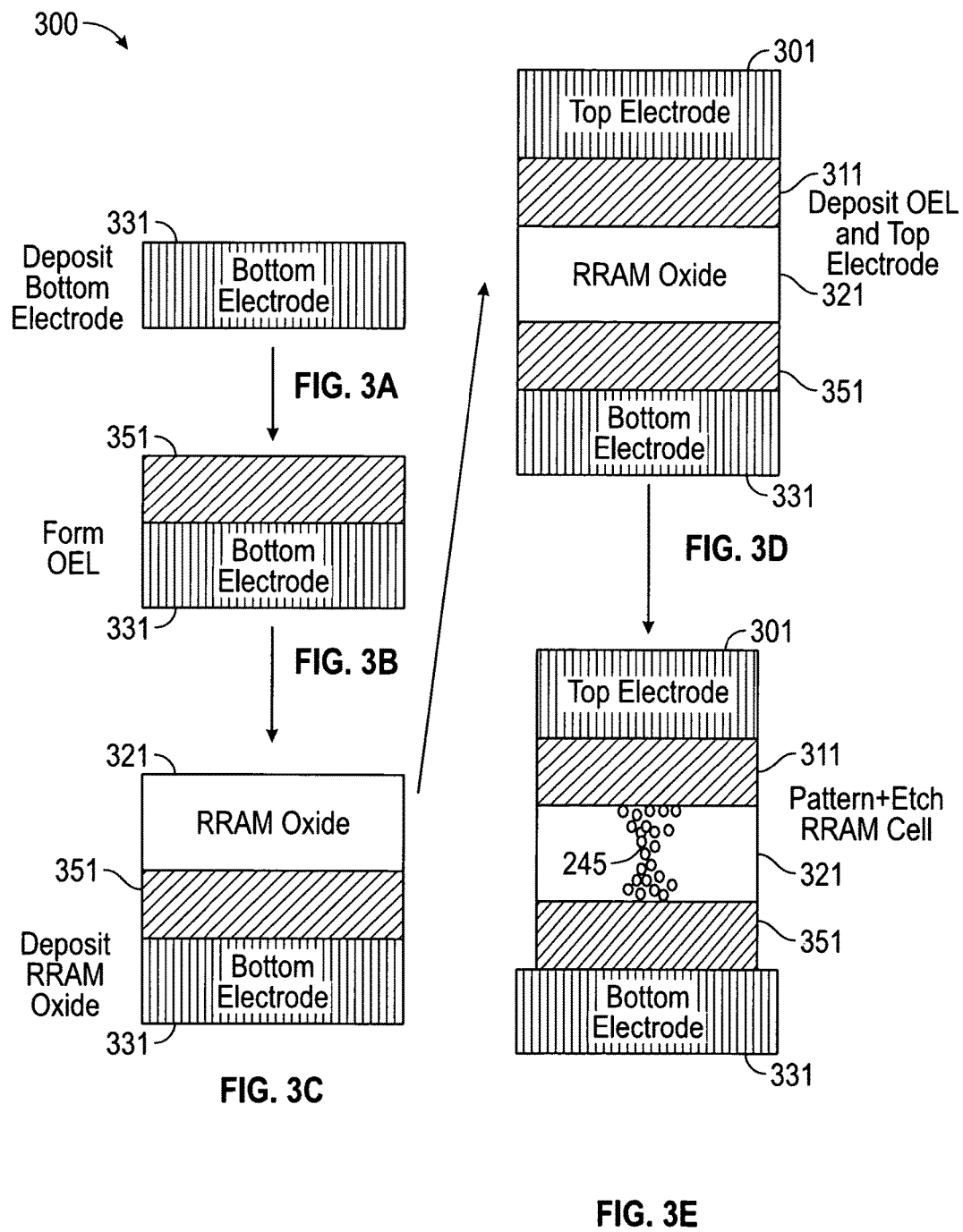
FIGS. 3a-3e include a method of forming a RRAM stack in an embodiment of the invention.

FIGS. 3a-3e include a method of forming a RRAM stack in an embodiment of the invention. In FIG. 3a the bottom electrode 331 is formed. In FIG. 3b the OEL 351 is deposited on the bottom electrode. Next oxide 321 is formed (FIG. 3c) followed by OEL 311 and top electrode 301 (FIG. 3d). Finally, patterning and etching occur to form the RRAM cell and an anneal is performed to produce filament 245 composed of oxygen vacancies (FIG. 3e).

Various embodiments disclosed herein have addressed RRAM stacks. Any such RRAM stack may be used in a memory cell by coupling one portion or node of the stack (e.g., top electrode of FIG. 2) to a bit-line and another node of the stack (e.g., bottom electrode of FIG. 2) to a source or drain node of a switching device, such as a selection transistor. The other of the source and drain node of the selection transistor may be coupled to a source line of the memory cell. The gate of the selection transistor may couple to a word-line. Such a memory cell may utilize resistance to store memory states. Embodiments provide smaller and more power efficient memory cells that can be scaled below, for example, 22 nm CD. The RRAM stack may couple to a sense amplifier. A plurality of the RRAM memory cells may be operably connected to one another to form a memory array, wherein the memory array can be incorporated into a non-volatile memory device. It is to be understood that the selection transistor may be connected to the top electrode or the bottom electrode of a RRAM stack.

Figure 4:
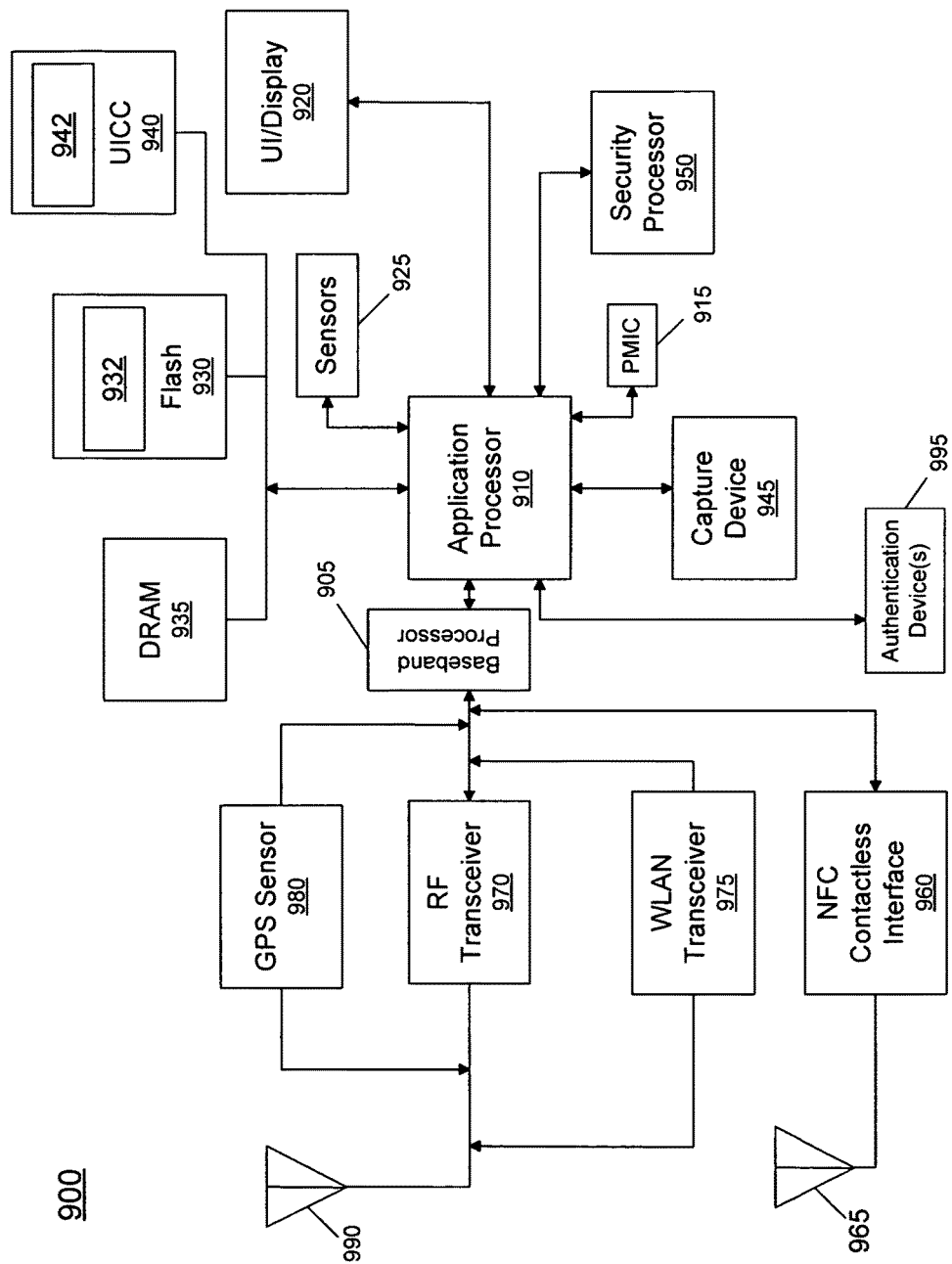
FIGS. 4 and 5 include system each including an embodiment of the RRAM stack.

Referring now to FIG. 4, shown is a block diagram of an example system with which embodiments can be used. As seen, system 900 may be a smartphone or other wireless communicator or any other internet of things (IoT) device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

System 900 may include hundreds or thousands of the above described memory cells/stacks (stack 200 of FIG. 2) and be critical to memory functions in system 900. The stability and power efficiency of such memory cells accumulates when the memory cells are deployed in mass and provides significant performance advantages (e.g., longer memory state storage in a broader range of operating temperatures) to such computing nodes. Memory 935, 932, 930, 942, 950 and other non-labeled memories may include memory stacks described herein.

Figure 5:
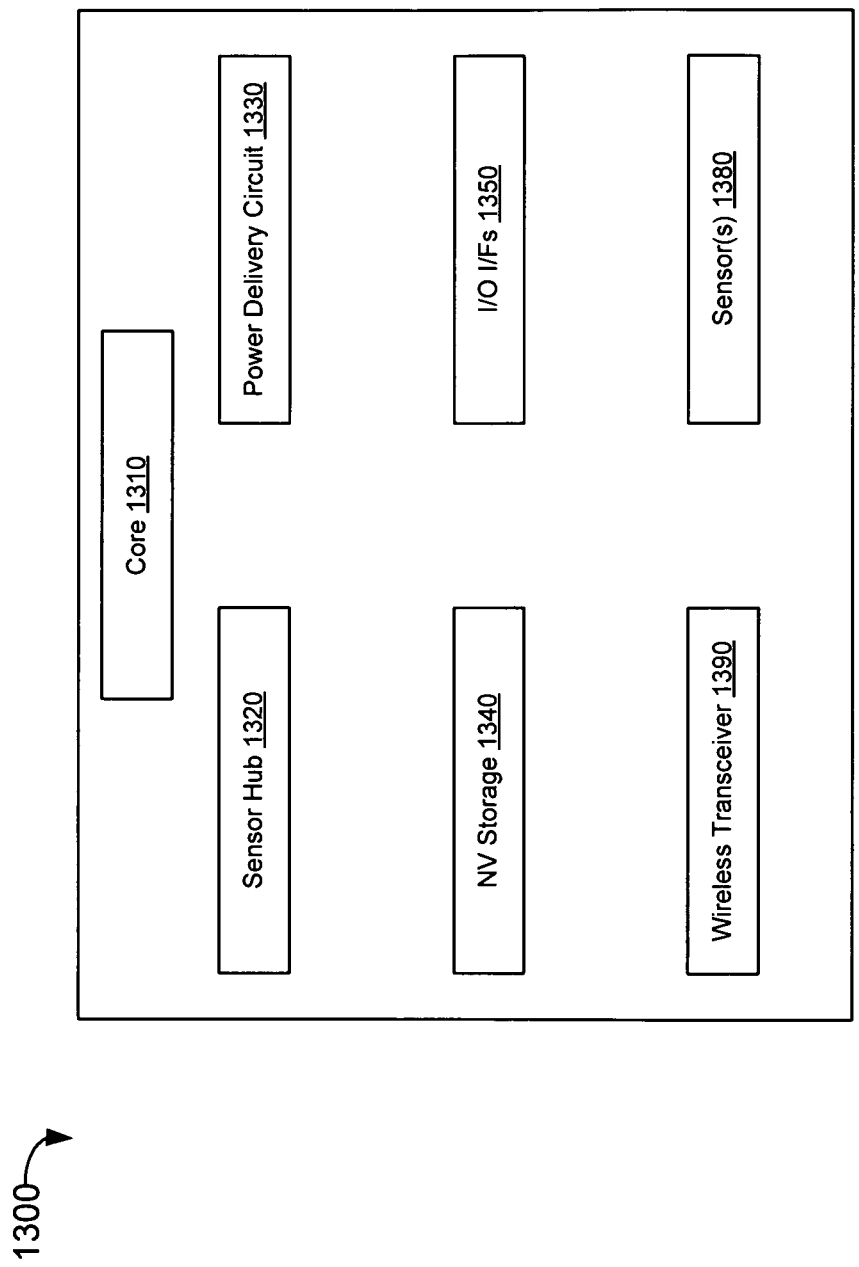

Embodiments may be used in environments where IoT devices may include wearable devices or other small form factor IoT devices. Referring now to FIG. 5, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which includes embodiments of the RRAM described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material that is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a memory comprising: a top electrode and a bottom electrode; a first oxygen exchange layer (OEL) between the top and bottom electrodes; a second OEL between the first OEL and the bottom electrode; and an oxide layer between the first and second OELs; wherein (a) a first plurality of oxygen vacancies are within the oxide layer and are adjacent the first OEL at a first concentration, (b) a second plurality of oxygen vacancies are within the oxide layer and are adjacent the second OEL at a second concentration, (c) a third plurality of oxygen vacancies are within the oxide layer and between the first and second pluralities of oxygen vacancies, and (d) the third concentration is less than both of the first and second concentrations.

"Top" and "bottom" are relative terms and may change based on the orientation of the stack. OEL is a term of art known to those of ordinary skill in the art. The OEL may also be referred to as a "metal cap layer". The OEL may include a metal such that, when the OEL is adjacent or contacting an oxygen source (e.g., oxide layer), the OEL facilitates "oxygen exchange" with the oxygen source. In an embodiment, OELs 211, 251 may include substoichiometric oxide or metal that is not fully oxidized.

In example 2 the subject matter of the Example 1 can optionally include wherein the oxide layer directly contacts both of the first and second OELs.

The direct contact may preclude barrier layers and the like.

In example 3 the subject matter of the Examples 1-2 can optionally include wherein the first OEL directly contacts the upper electrode and the second OEL directly contacts the bottom electrode.

In example 4 the subject matter of the Examples 1-3 can optionally include wherein the memory is a resistive random access memory (RRAM).

In example 5 the subject matter of the Examples 1-4 can optionally include wherein the first OEL includes a metal and the second OEL also includes the metal.

In example 6 the subject matter of the Examples 1-5 can optionally include wherein the metal includes at least one member selected from the group comprising: Hafnium (Hf), Titanium (Ti), Tantalum (Ta), Erbium (Er), and Gadolinium (Gd).

In example 7 the subject matter of the Examples 1-6 can optionally include wherein the oxide layer includes at least one member selected from the group comprising HfOx, SiOx, $Al_2Ox$, TiOx, TaOx, GdOx, ErOx, NbOx, WOx, ZnOx, and InGaZnOx.

In example 8 the subject matter of the Examples 1-7 can optionally include wherein the top electrode includes at least one member selected from the group comprising TiN, TaN, W, Ru, Ir, Pd, Pt, Mo, TiAlN, and TaAlN and the bottom electrode also includes the at least one member.

In an embodiment the top and bottom electrodes include different materials. In an embodiment, the "top" electrode may be a metal or alloy of metals (TiN, TaN, W, Ru, Ir, TiAlN, or other good barrier materials) while the "bottom" electrode is a high work function metal" (W, Pd, Pt, Ru, Mo, TiN or other high work function metal).

In example 9 the subject matter of the Examples 1-8 can optionally include wherein the first plurality of oxygen vacancies are immediately adjacent the first OEL and the second plurality of oxygen vacancies are immediately adjacent the second OEL.

By "immediately adjacent" some of the vacancies may be in direct contact with an OEL.

In example 10 the subject matter of the Examples 1-9 can optionally include wherein: in a first state when energy is applied to the top electrode at a first polarity the first, second, and third pluralities of oxygen vacancies form a first filament having a first electrical resistance; and in a second state when energy is applied to the top electrode at a second polarity, which is opposite the first polarity, the first, second, and third pluralities of oxygen vacancies form a second filament having a second electrical resistance that is greater than the first electrical resistance.

In example 11 the subject matter of the Examples 1-10 can optionally include wherein in the second state the third plurality of oxygen vacancies is at the third concentration and in the first state the third plurality of oxygen vacancies is at an additional concentration that is greater than the third concentration.

In example 12 the subject matter of the Examples 1-11 can optionally include wherein: in the first state the first filament has an hour glass shape with a first width adjacent the first OEL, a second width adjacent the second OEL, and a third width between the first and second widths; and the third width is less than the first and second widths.

In example 13 the subject matter of the Examples 1-12 can optionally include wherein in an initial forming state when energy is applied to the top electrode at the first polarity the first, second, and third pluralities of oxygen vacancies form the, first filament; wherein the initial forming state precedes the first and second states.

In example 14 the subject matter of the Examples 1-13 can optionally include wherein: in a first state when energy is applied to the top electrode at a first polarity the first, second, and third pluralities of oxygen vacancies form a first filament having a first electrical resistance; and in a second state when energy is applied to the top electrode at a second polarity, which is opposite the first polarity, the first, second, and third pluralities of oxygen vacancies form a path between the top and bottom electrodes having a second electrical resistance that is greater than the first electrical resistance.

The second electrical resistance may be very high when the path is incomplete due to an absence of vacancies at area 243.

In example 15 the subject matter of the Examples 1-14 can optionally include wherein the first OEL has a first maximum vertical thickness and the second OEL has a second maximum vertical thickness that is substantially equal to the first maximum vertical thickness.

In example 16 the subject matter of the Examples 1-15 can optionally include wherein the first OEL has a first maximum vertical thickness and the second OEL has a second maximum vertical thickness that is unequal to the first maximum vertical thickness.

For example, in an embodiment the one of the OEL is 3%, 5%, 10%, 15%, 20% or more thicker than the other of the OELs.

In example 17 the subject matter of the Examples 1-16 can optionally include wherein the first OEL includes a first metal and the second OEL includes a second metal different from the first metal.

By saying the second metal is different from the first metal the first metal may include only "A" while the second metal includes "B" or $A_xB_{1-x}$, where only A is different than $A_xB_{1-x}$.

In example 18 the subject matter of Examples 1-17 can optionally include a system comprising: a processor; a memory, coupled to the processor, according to any one of examples claims 1 to 17; and a communication module, coupled to the processor, to communicate with a computing node external to the system.

A version of Example 18 is shown in FIGS. 4 and 5.

Example 19 includes a resistive random access memory (RRAM) comprising: top and bottom electrodes; first and second oxygen exchange layers (OELs) between the top and bottom electrodes; an oxide layer between the first and second OELs; wherein (a) first oxygen vacancies are within an upper third of the oxide layer at a first concentration, (b) second oxygen vacancies are within a lower third of the oxide layer at a second concentration, and (c) third oxygen vacancies are within a middle third of the oxide layer at a third concentration that is less than either of the first and second concentrations.

In example 20 the subject matter of the Examples 19 can optionally include wherein the oxide layer directly contacts both of the first and second OELs.

In example 21 the subject matter of the Examples 19-20 can optionally include wherein: in a first state when energy is applied to the top electrode at a first polarity the first, second, and third pluralities of oxygen vacancies form a first path having a first electrical resistance; and in a second state when energy is applied to the top electrode at a second polarity, which is opposite the first polarity, the first, second, and third pluralities of oxygen vacancies form a second path between the top and bottom electrodes having a second electrical resistance that is greater than the first electrical resistance.

Example 22 includes a method comprising: forming a bottom electrode; forming a second oxygen exchange layer (OEL) on the bottom electrode; forming an oxide layer on the second OEL; forming a first OEL on the oxide layer; forming a top electrode on the first OEL; patterning the first and second OELs and the oxide layer to form a resistive random access memory (RRAM) cell; and annealing the RRAM cell to produce a filament, composed of oxygen vacancies, in the oxide layer.

In example 23 the subject matter of the Example 22 can optionally include wherein the oxide layer directly contacts the first and second OELs.

Example 24 includes a resistive random access memory (RRAM) comprising: top and bottom electrodes; first and second oxygen exchange layers (OELs) between the top and bottom electrodes; an oxide layer between the first and second OELs; wherein in a first state when energy is applied to the top electrode at a first polarity first, second, and third pluralities of oxygen vacancies form a first path having a first electrical resistance; wherein in a second state when energy is applied to the top electrode at a second polarity, which is opposite the first polarity, the first, second, and third pluralities of oxygen vacancies form a second path between the top and bottom electrodes having a second electrical resistance that is greater than the first electrical resistance; wherein in the first state: (a) the first oxygen vacancies are within an upper third of the oxide layer at a first concentration, (b) the second oxygen vacancies are within a lower third of the oxide layer at a second concentration, and (c) the third oxygen vacancies are within a middle third of the oxide layer at a third concentration that is less than either of the first and second concentrations.

Thus, example 24 applies to, for example, arrays of memory that have not yet experienced an initiation or filament forming event but will once put into testing or general use.

In example 25 the subject matter of Example 24 can optionally include wherein the first oxygen vacancies are within the upper third of the oxide layer at the first concentration, (b) the second oxygen vacancies are within the lower third of the oxide layer at the second concentration, and (c) the third oxygen vacancies are within the middle third of the oxide layer at the third concentration.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A memory comprising:
   a top electrode and a bottom electrode;
   a first oxygen exchange layer (OEL) between the top and bottom electrodes;
   a second OEL between the first OEL and the bottom electrode; and
   an oxide layer between the first and second OELs;
   wherein (a) a first plurality of oxygen vacancies are within the oxide layer and are adjacent the first OEL at a first concentration, (b) a second plurality of oxygen vacancies are within the oxide layer and are adjacent the second OEL at a second concentration, (c) a third plurality of oxygen vacancies at a third concentration are within the oxide layer and between the first and second pluralities of oxygen vacancies, and (d) the third concentration is less than both of the first and second concentrations;
   wherein the first OEL is configured to exchange oxygen with the oxide layer and the second OEL is configured to exchange oxygen with the oxide layer.

2. The memory of claim 1, wherein:
   the oxide layer directly contacts both of the first and second OELs;
   the first OEL is configured to scavenge oxygen from the oxide layer;
   the second OEL is configured to scavenge oxygen from the oxide layer.

3. The memory of claim 2, wherein the first OEL directly contacts the upper electrode and the second OEL directly contacts the bottom electrode.

4. The memory of claim 3, wherein the memory is a resistive random access memory (RRAM).

5. The memory of claim 2, wherein the first OEL includes a metal and the second OEL also includes the metal.

6. The memory of claim 5, wherein the metal includes at least one Hafnium (Hf), Titanium (Ti), Tantalum (Ta), Erbium (Er), Gadolinium (Gd), or combinations thereof.

7. The memory of claim 6, wherein the oxide layer includes at least one of HfOx, SiOx, Al$_2$Ox, TiOx, TaOx, GdOx, ErOx, NbOx, WOx, ZnOx, InGaZnOx, or combinations thereof.

8. The memory of claim 6, wherein:
   the top electrode includes a first material that includes at least one of TiN, TaN, W, Ru, Ir, Pd, Pt, Mo, TiAlN, or combinations thereof;
   the bottom electrode includes a second material that includes least one of W, Pd, Pt, Ru, Mo, TiN, or combinations thereof;
   the first material is unequal to the second material.

9. The memory of claim 2, wherein the first plurality of oxygen vacancies are immediately adjacent the first OEL and the second plurality of oxygen vacancies are immediately adjacent the second OEL.

10. The memory of claim 2, wherein:
    in a first state when energy is applied to the top electrode at a first polarity the first, second, and third pluralities of oxygen vacancies form a first filament having a first electrical resistance; and
    in a second state when energy is applied to the top electrode at a second polarity, which is opposite the first polarity, the first, second, and third pluralities of oxygen vacancies form a second filament having a second electrical resistance that is greater than the first electrical resistance.

11. The memory of claim 10, wherein in the second state the third plurality of oxygen vacancies is at the third concentration and in the first state the third plurality of oxygen vacancies is at an additional concentration that is greater than the third concentration.

12. The memory of claim 10, wherein:
    in the first state the first filament has an hour glass shape with a first width adjacent the first OEL, a second width adjacent the second OEL, and a third width between the first and second widths; and
    the third width is less than the first and second widths.

13. The memory of claim 10, wherein in an initial forming state when energy is applied to the top electrode at the first polarity the first, second, and third pluralities of oxygen vacancies form the first filament; wherein the initial forming state precedes the first and second states.

14. The memory of claim 8, wherein:
    in a first state when energy is applied to the top electrode at a first polarity the first, second, and third pluralities of oxygen vacancies form a first path having a first electrical resistance; and
    in a second state when energy is applied to the top electrode at a second polarity, which is opposite the first polarity, the first, second, and third pluralities of oxygen vacancies form a second path having a second electrical resistance that is greater than the first electrical resistance.

15. The memory of claim 2, wherein the first OEL has a first maximum vertical thickness and the second OEL has a second maximum vertical thickness that is substantially equal to the first maximum vertical thickness.

16. The memory of claim 2, wherein the first OEL has a first maximum vertical thickness and the second OEL has a second maximum vertical thickness that is unequal to the first maximum vertical thickness.

17. The memory of claim 2, wherein the first OEL includes a first metal and the second OEL includes a second metal different from the first metal.

18. A system comprising:
    a processor;
    a memory, coupled to the processor, according to claim 1; and
    a communication module, coupled to the processor, to communicate with a computing node external to the system.

19. A resistive random access memory (RRAM) comprising:
    top and bottom electrodes;
    first and second oxygen exchange layers (OELs) between the top and bottom electrodes;
    an oxide layer between the first and second OELs;
    wherein (a) first oxygen vacancies are within an upper third of the oxide layer at a first concentration, (b) second oxygen vacancies are within a lower third of the oxide layer at a second concentration, and (c) third oxygen vacancies are within a middle third of the oxide layer at a third concentration that is less than either of the first and second concentrations;

wherein the first OEL is configured to exchange oxygen with the oxide layer and the second OEL is configured to exchange oxygen with the oxide layer.

20. The RRAM of claim 19, wherein:

the oxide layer directly contacts both of the first and second OELs;

the first OEL is configured to scavenge oxygen from the oxide layer;

the second OEL is configured to scavenge oxygen from the oxide layer.

21. The RRAM of claim 20, wherein:

in a first state when energy is applied to the top electrode at a first polarity the first, second, and third pluralities of oxygen vacancies form a first path having a first electrical resistance; and in a second state when energy is applied to the top electrode at a second polarity, which is opposite the first polarity, the first, second, and third pluralities of oxygen vacancies form a second path between the top and bottom electrodes having a second electrical resistance that is greater than the first electrical resistance;

the first OEL includes at least one of a substoichiometric oxide, a metal that is not fully oxidized, or combinations thereof;

the second OEL includes at least one of the substoichiometric oxide, an additional sub stoichiometric oxide, the metal, an additional metal that is not fully oxidized, or combinations thereof.

22. A method comprising:

forming a bottom electrode;

forming a second oxygen exchange layer (OEL) on the bottom electrode;

forming an oxide layer on the second OEL;

forming a first OEL on the oxide layer;

forming a top electrode on the first OEL;

patterning the first and second OELs and the oxide layer to form a resistive random access memory (RRAM) cell; and annealing the RRAM cell to produce a filament, composed of oxygen vacancies, in the oxide layer;

wherein the first OEL is configured to exchange oxygen with the oxide layer and the second OEL is configured to exchange oxygen with the oxide layer.

23. The method of claim 22, wherein the oxide layer directly contacts the first and second OELs.

24. A resistive random access memory (RRAM) comprising:

top and bottom electrodes;

first and second oxygen exchange layers (OELs) between the top and bottom electrodes;

an oxide layer between the first and second OELs;

wherein in a first state when energy is applied to the top electrode at a first polarity first, second, and third pluralities of oxygen vacancies form a first path having a first electrical resistance;

wherein in a second state when energy is applied to the top electrode at a second polarity, which is opposite the first polarity, the first, second, and third pluralities of oxygen vacancies form a second path between the top and bottom electrodes having a second electrical resistance that is greater than the first electrical resistance;

wherein in the first state: (a) the first oxygen vacancies are within an upper third of the oxide layer at a first concentration, (b) the second oxygen vacancies are within a lower third of the oxide layer at a second concentration, and (c) the third oxygen vacancies are within a middle third of the oxide layer at a third concentration that is less than either of the first and second concentrations;

wherein the first OEL is configured to exchange oxygen with the oxide layer and the second OEL is configured to exchange oxygen with the oxide layer.

25. The RRAM of claim 24, wherein the first oxygen vacancies are within the upper third of the oxide layer at the first concentration, (b) the second oxygen vacancies are within the lower third of the oxide layer at the second concentration, and (c) the third oxygen vacancies are within the middle third of the oxide layer at the third concentration.

* * * * *